US006417095B1

(12) United States Patent
Chen

(10) Patent No.: US 6,417,095 B1
(45) Date of Patent: Jul. 9, 2002

(54) METHOD FOR FABRICATING A DUAL DAMASCENE STRUCTURE

(75) Inventor: Chung-Tai Chen, Hsinchu Hsien (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 09/878,880

(22) Filed: Jun. 11, 2001

(30) Foreign Application Priority Data

Apr. 19, 2001 (TW) .......................................... 90109368

(51) Int. Cl.⁷ .......................................... H01L 21/4763
(52) U.S. Cl. ...................... 438/633; 438/616; 438/618; 438/623; 438/632; 438/640
(58) Field of Search ................................ 257/751, 762, 257/763; 438/622, 633, 634, 618, 616, 623, 624, 637, 638, 639, 640

(56) References Cited

U.S. PATENT DOCUMENTS

| 6,157,081 | A | * | 12/2000 | Nariman et al. | 257/752 |
| 6,159,661 | A | * | 12/2000 | Huang et al. | 430/313 |
| 6,261,963 | B1 | * | 7/2001 | Zhao et al. | 438/704 |
| 6,265,779 | B1 | * | 7/2001 | Grill et al. | 257/759 |
| 6,309,955 | B1 | * | 10/2001 | Subramanian et al. | 438/618 |
| 6,323,121 | B1 | * | 11/2001 | Liu et al. | 438/633 |
| 6,365,502 | B1 | * | 4/2002 | Parnjpe et al. | 438/622 |
| 6,368,967 | B1 | * | 4/2002 | Besser | 438/687 |
| 6,372,572 | B1 | * | 4/2002 | Yu et al. | 438/241 |

FOREIGN PATENT DOCUMENTS

| JP | 10352638 | * | 6/2000 | ......... H01L/21/768 |
| JP | 11053318 | * | 9/2000 | ....... H01L/21/3205 |
| JP | 11147282 | * | 12/2000 | ....... H01L/21/3205 |

* cited by examiner

Primary Examiner—John F. Niebling
Assistant Examiner—Renzo N. Rocchegiani
(74) Attorney, Agent, or Firm—J.C. Patents

(57) ABSTRACT

A fabrication method for a dual damascene structure is provided. A barrier layer and a copper seed layer are formed on a substrate comprising a dual damascene opening, wherein the barrier layer and the copper seed layer cover the dual damascene opening. A sacrificial layer is then formed on the copper seed layer, filling the dual damascene opening. Using the copper seed layer as an etch stop layer, the sacrificial layer is etch back. The exposed copper seed layer is then removed, followed by completely removing the sacrificial layer. A metal copper layer is formed in the dual damascene opening by plating, filling the opening of the dual damascene opening.

19 Claims, 3 Drawing Sheets

METHOD FOR FABRICATING A DUAL DAMASCENE STRUCTURE

CROSS-REFERENCE TO RELATED APPLICATION

This application claims the priority benefit of Taiwan application serial no. 90109368, filed Apr. 19, 2001.

BACKGROUND OF THE INVENTION

1. Field of Invention

This invention relates to a fabrication method for metal interconnects. More particularly, the present invention relates to a fabrication method for a dual damascene structure.

2. Description of Related Art

In the semiconductor industry, to increase the operating speed of a device is an important goal that is constantly being pursued. It is also a major element being demanded by the consumer. In the current speedy development of integrated circuits, the determining factors affecting the operating speed include the resistance of the conductive line and the degree of parasitic capacitance of the dielectric layer. Reducing the resistance of the conductive line can be achieved by selecting low resistance metal material, whereas reducing the parasitic capacitance of the dielectric layer can be achieved by selecting low dielectric constant dielectric material for the insulation layer formed between the multi-level metal interconnects.

The manufacturing for typical metal interconnects includes forming a metal plug in the dielectric layer, followed by forming an aluminum conductive line on the substrate to connect with the metal plug. Dual damascene is a highly reliable and low cost technique for the fabrication of metal lines. Furthermore, the material used for the metal interconnects is not a factor to the limitations in metal etching. The dual damascene technique is thus a popular technique to use in the manufacturing of copper conductive lines to reduce the resistance of the conductive lines and to increase the speed and quality of the integrated-circuit device. As the device becomes more highly integrated, low dielectric constant dielectric layer is used for the manufacturing of the dual damascene structure, which becomes one of the approach in the manufacturing of metal interconnects in the semiconductor industry.

The manufacturing of a dual damascene structure according to the prior art basically includes forming a dielectric layer on a substrate, followed by forming a dual damascene opening in the dielectric layer. Metal copper further fills the dual damascene opening. After this, chemical mechanical polishing is conducted for planarization. Chemical mechanical polishing is used in the back end of line of the above process. However, it is a common knowledge that chemical mechanical polishing would lead to problems including scratch marks remaining on the planarized surface, rip off, particle residue, dishing, erosion, oxide layer generated on the copper surface and diffusion of copper ions in the washing process subsequent to the chemical mechanical polishing process. The defects resulted from the chemical mechanical polishing process would also lead to a lower yield and a reduction in reliability.

SUMMARY OF THE INVENTION

The present invention provides a fabrication method for a dual damascene structure, wherein the application of chemical mechanical polishing can be avoided.

The present invention provides a fabrication method for a dual damascene structure. A barrier layer is formed on a semiconductor structure that already comprises a dual damascene opening, wherein the barrier layer covers the dual damascene opening. A seed layer is formed on the barrier layer, covering the surface of the barrier layer. A sacrificial layer is then formed on the seed layer, filling the dual damascene opening. Using the seed layer as an etch-stop layer, the sacrificial layer is etched back. The exposed seed layer is then removed, followed by completely removing the sacrificial layer. Plating is further performed to form a metal layer in the dual damascene opening, filling the dual damascene opening and completing the fabrication of a dual damascene structure. Since the dual damascene structure is manufactured with etching and filling steps described above, there is no need to use any CMP process for making the dual damascene structure. Thus, this prevents the defect problem induced by adopting the CMP process.

The invention provides a fabrication for a dual damascene of the semiconductor back-end of line manufacturing, wherein the application of chemical mechanical polishing is avoided by using a sacrificial layer. This method is also applicable for the back-end of line interconnect manufacturing. Since the common approach in using copper as interconnect requires the application of chemical mechanical polishing for planaization, the problems resulted from chemical mechanical polishing is inevitable. Problems of such include scratch marks remaining on the planarized surface, rip off, particle residue, dishing, erosion, oxide layer generated on the copper surface and diffusion of copper ions in the washing process subsequent to chemical mechanical polishing. The present invention, therefore, avoids the application of chemical mechanical polishing to prevent the above problems. Other potential problems that are resulted from the application of chemical mechanical polishing can also be avoided to increase the yield and to achieve the desired reliability of the product.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A through 1G are schematic, cross-sectional views, illustrating successive steps for fabricating a dual damascene structure according to a preferred embodiment of the present invention. This method is also applicable for the back-end of line (BEOL) interconnects manufacturing.

Figure 1A:
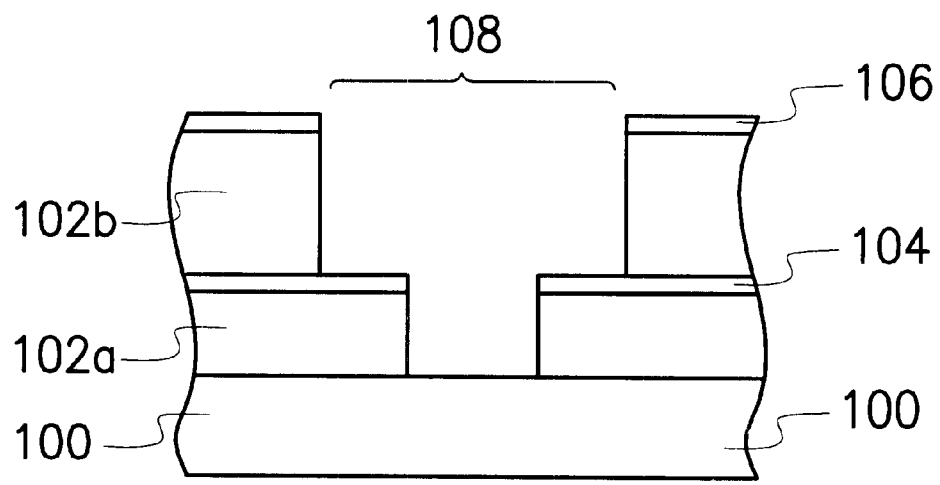
FIGS. 1A through 1G are schematic, cross-sectional views, illustrating successive steps for fabricating a dual damascene structure according to a preferred embodiment of the present invention.

As shown in FIG. 1A, a substrate 100 is provided, wherein a low dielectric constant dielectric layer 102a, an etch stop layer 104, a low dielectric constant dielectric layer 102b and a mask layer 106 are sequentially formed on the substrate 100. The mask layer 106 is, for example, a silicon nitride layer, a silicon carbon layer or a boron nitride layer. A low dielectric constant dielectric material has a dielectric constant, for example, below 3.5. A dual damascene opening 108 is then formed on the substrate 100. The fabrication for a typical dual damascene opening 108 includes, for example, forming a photoresist layer (not shown in Figure) on the mask layer 106, followed by defining and etching the photoresist layer to form a via opening in the low dielectric constant dielectric layers 102a, 102b. The photoresist layer is then removed, followed by forming another photoresist layer (not shown in Figure) on the mask layer 106. This photoresist layer is then defined and etched to the etch stop layer 106 to form a trench. The trench is formed above the via opening, and the formation of a dual damascene opening is thus completed.

Figure 1B:
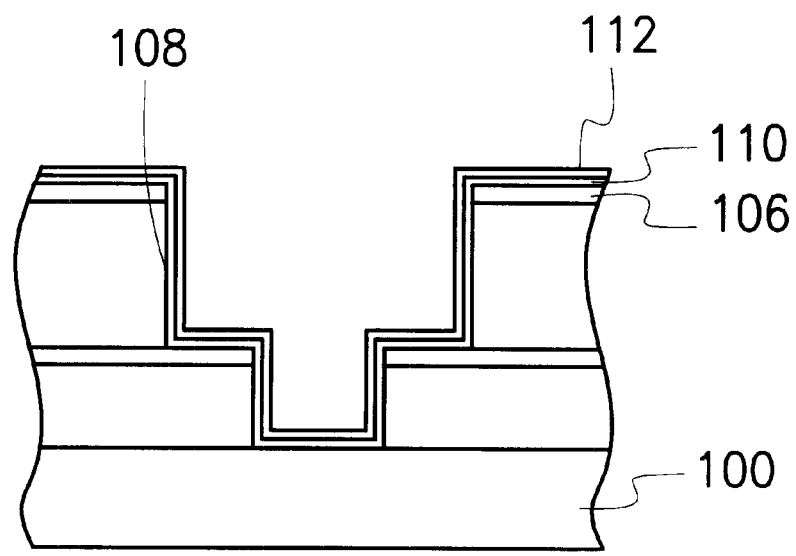

Referring to FIG. 1B, a barrier layer 110 is formed on the surface of the dual damascene opening 108 and the mask layer 106, followed by forming a copper seed layer 112 to cover the surface of the barrier layer 110. The copper seed layer 112 is formed by, for example, physical vapor deposition (PVD) or chemical vapor deposition (CVD).

Figure 1C:
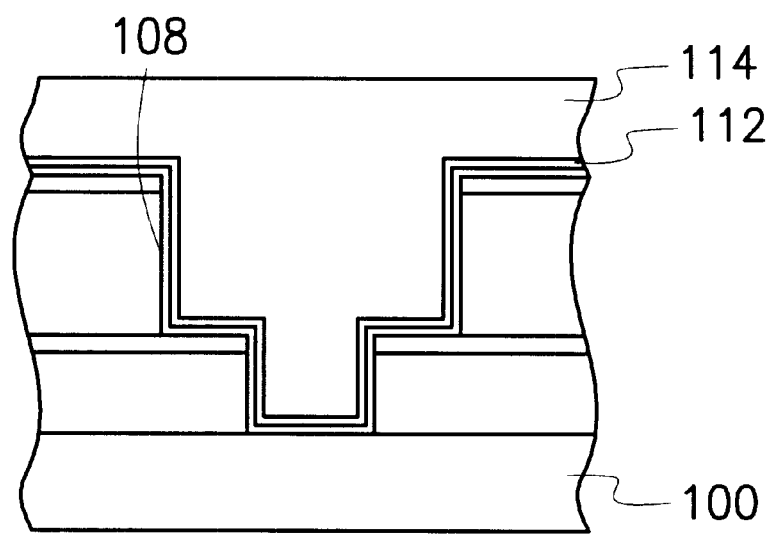

Continuing to FIG. 1C, a sacrificial layer 114 is formed, covering the surface of the copper seed layer 112 and filling the dual damascene opening 108. The sacrificial layer 114, for example, boron phosphorous silica glass (BPSG) has a good gap filling capability.

Figure 1D:
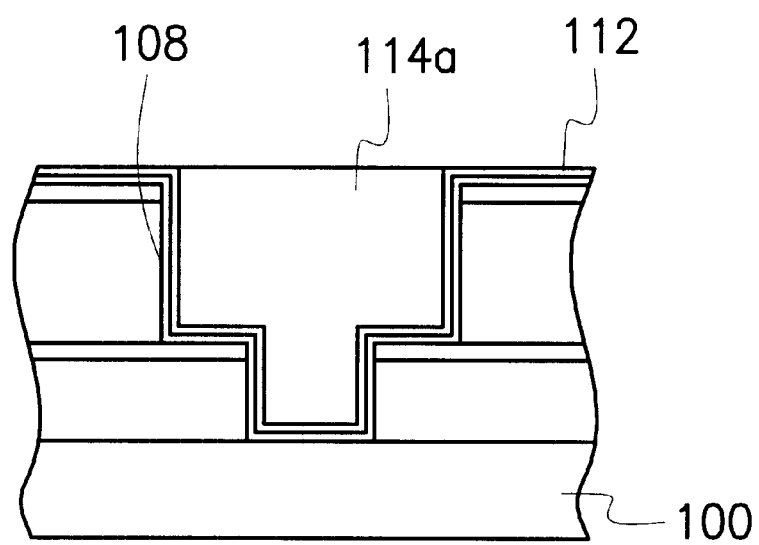

Thereafter, as shown in FIG. 1D, an etch-back process is conducted to remove the excess sacrificial layer 114 outside the dual damascene opening 108, using the copper seed layer 112 as an etch stop layer. Subsequent to the etch-back process, the copper seed layer 112 is exposed and the dual damascene opening 108 is filled with the sacrificial layer 114a.

Figure 1E:
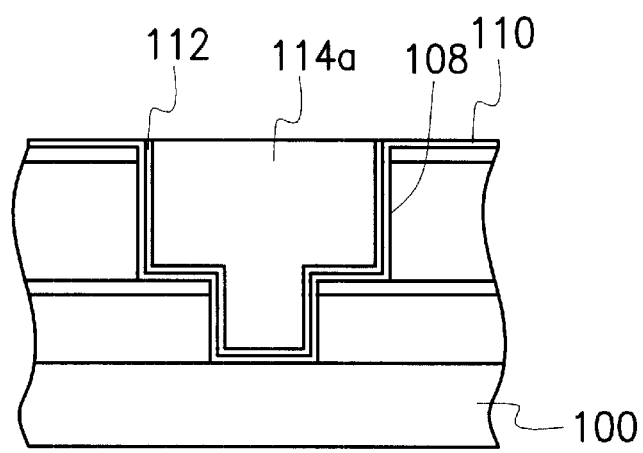

As shown in FIG. 1E, the portion of the copper seed layer 112 outside the dual damascene opening 108 is removed, using an acidic solution as an etchant, such as sulfuric acid. Since the copper seed layer 112 outside the dual damascene opening 108 is removed, the subsequent plating process in forming the metal layer becomes more selective. Chemical mechanical processing can therefore be avoided.

Figure 1F:
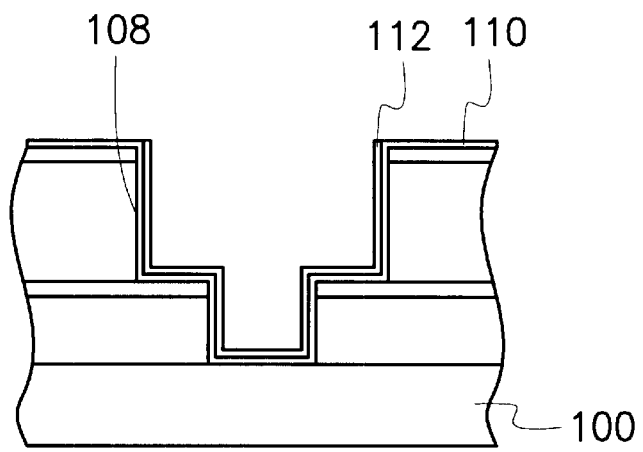

Continuing to FIG. 1F, the sacrificial layer 114a in the dual damascene opening 108 is removed, exposing the copper seed layer 112 on the surface of the dual damascene opening 108. The sacrificial layer 114a may be removed by, for example, isotropic dry etching using hydrogen fluoride vapor as an etchant. Using isotropic dry etching to removed the sacrificial layer 114a provides the advantages of high etching rates and high etching selectivity ratio. The processing time is thereby reduced. Furthermore, the copper seed layer 112 is less likely to be eroded.

Figure 1G:
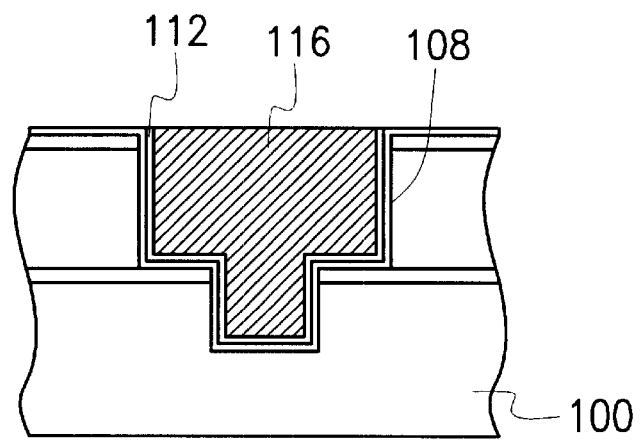

Referring to FIG. 1G, plating is conducted on the dual damascene opening 108 to form a metal copper layer 116 in the dual damascene opening 108, filling the dual damascene opening 108.

The invention provides a fabrication for the semiconductor back-end of line manufacturing of dual damascene, wherein the application of chemical mechanical polishing is avoided by using a sacrificial layer. This method is also applicable for the back-end of line interconnect manufacturing. Since the common approach in using copper as interconnect requires the application of chemical mechanical polishing for planaization, the problems resulted from chemical mechanical polishing becomes inevitable. Problems of such include scratch marks remained on the planarized surface, rip off, particle residue, dishing, erosion, oxide layer generated on the copper surface and diffusion of copper ions in the washing process subsequent to chemical mechanical polishing. The present invention, therefore, avoided the application of chemical mechanical polishing to prevent the above problems. Other potential problems that are resulted from the application of chemical mechanical polishing can also be avoided to increase the yield and to achieve the desired reliability of the product.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a dual damascene structure, comprising:

providing a semiconductor structure with a mask formed thereon;

forming a dual damascene opening in the semiconductor structure;

forming a barrier layer for covering the dual damascene opening;

forming a seed layer for covering the barrier layer;

forming a sacrificial layer for filling the dual damascene opening and covering a surface of the seed layer that covers the mask layer;

removing a portion of the sacrificial layer by back etching to expose the seed layer on the mask layer, using the seed layer as an etch stop layer;

removing a portion of the seed layer outside the dual damascene opening;

removing the sacrificial layer completely; and forming a metal layer on the seed layer by plating, filling the dual damascene opening and completing the fabrication of the dual damascene structure.

2. The method of claim 1, wherein the semiconductor structure comprises of a substrate and a low dielectric constant dielectric layer formed on the substrate.

3. The method of claim 1, wherein the sacrificial layer includes boron phosphorus silica glass.

4. The method of claim 3, wherein removing the sacrificial layer completely includes performing isotropic dry etching.

5. The method of claim 4, removing the sacrificial layer completely includes using hydrogen fluoride vapor as a reactant.

6. The method of claim 1, wherein the seed layer includes copper.

7. The method of claim 1, wherein the seed layer is formed by physical vapor deposition or chemical vapor deposition.

8. The method of claim 1, wherein the mask layer is silicon nitride, silicon carbon or boron nitride.

9. The method of claim 1, wherein removing a portion of the seed layer outside the dual damascene opening includes performing a wet etching process.

10. The method of claim 9, wherein an etchant for the wet etching process includes an acidic solution.

11. The method of claim 10, wherein the etchant for the wet etching process includes sulfuric acid.

12. A fabrication method for a dual damascene structure, comprising:

forming a dielectric layer on a substrate, wherein a mask layer is formed on a surface of the dielectric layer;

forming a dual damascene opening in the low dielectric constant dielectric layer and the mask layer;

forming a copper seed layer on the substrate, covering a surface of the dual damascene opening and the mask layer;

forming a sacrificial layer on the substrate, filling the dual damascene opening;

removing a portion of the sacrificial layer until a portion of the seed layer is exposed;

removing the exposed portion of the copper seed layer;

removing a remaining portion of the sacrificial layer; and forming a metal copper layer to fill the damascene opening.

13. The method of claim 12, wherein the sacrificial layer includes boron phosphorus silica glass.

14. The method of claim 13, wherein removing the remaining portion of the sacrificial layer include performing isotropic etching using hydrogen fluoride vapor as an etchant.

15. The method of claim 12, wherein the copper seed layer is formed by physical vapor deposition or chemical vapor deposition.

16. The method of claim 12, wherein the mask layer is silicon nitride, silicon carbon or boron nitride.

17. The method of claim 12, wherein removing the portion of the copper seed layer outside the dual damascene opening is formed by performing a wet etching process.

18. The method of claim 17, wherein an acidic solution is used as an etchant for the wet etching process.

19. The method of claim 18, wherein sulfuric acid is used as the etchant for the wet etching process.

* * * * *